(12) United States Patent
Huang et al.

(10) Patent No.: US 12,339,552 B2
(45) Date of Patent: Jun. 24, 2025

(54) DISPLAY PANEL AND DISPLAY DEVICE

(71) Applicant: TIANMA ADVANCED DISPLAY TECHNOLOGY INSTITUTE (XIAMEN) CO., LTD., Xiamen (CN)

(72) Inventors: Yukun Huang, Xiamen (CN); Liang Xing, Xiamen (CN); Zhen Liu, Shanghai (CN); Zhenyu Jia, Xiamen (CN); Aowen Li, Xiamen (CN); Rusheng Liu, Xiamen (CN); Kerui Xi, Xiamen (CN)

(73) Assignee: TIANMA ADVANCED DISPLAY TECHNOLOGY INSTITUTE (XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 18/463,334

(22) Filed: Sep. 8, 2023

(65) Prior Publication Data
US 2023/0418124 A1 Dec. 28, 2023

(30) Foreign Application Priority Data

Jun. 30, 2023 (CN) .......................... 202310792301.1

(51) Int. Cl.
*G02F 1/137* (2006.01)
*G02F 1/133* (2006.01)
*G02F 1/1343* (2006.01)
*H01L 25/16* (2023.01)

(52) U.S. Cl.
CPC .......... *G02F 1/137* (2013.01); *G02F 1/13312* (2021.01); *G02F 1/134309* (2013.01); *H01L 25/167* (2013.01); *G02F 2201/44* (2013.01); *G02F 2202/04* (2013.01)

(58) Field of Classification Search
CPC ................. G02F 1/137; G02F 1/13312; G02F 1/134309; G02F 2201/44; G02F 2202/04; H01L 25/167
USPC .......................................................... 349/33
See application file for complete search history.

(56) References Cited

U.S. PATENT DOCUMENTS

2021/0405407 A1* 12/2021 Sun ................... G02F 1/133331
2022/0187644 A1* 6/2022 Lu .......................... G02F 1/1368
2023/0333426 A1* 10/2023 Wang ..................... G02F 1/1337

FOREIGN PATENT DOCUMENTS

CN           103434452 A        12/2013
CN           111399222 A         7/2020

* cited by examiner

*Primary Examiner* — Michael H Caley
*Assistant Examiner* — William D Peterson
(74) *Attorney, Agent, or Firm* — KILPATRICK TOWNSEND & STOCKTON LLP

(57) ABSTRACT

A display panel and a display device are provided. The display panel includes a display area. The display area includes multiple pixel areas and multiple light transmissive areas arranged in an array. The display panel further includes a dimming part and at least one photosensitive component. Along a thickness direction of the display panel, at least a part of the dimming part at least partially overlaps with the light transmissive areas. The photosensitive component is electrically connected to the dimming part. With the display panel and a display device according to the present disclosure, a display effect of the display panel can be effectively improved.

20 Claims, 11 Drawing Sheets

DISPLAY PANEL AND DISPLAY DEVICE

This application claims priority to Chinese Patent Application No. 202310792301.1, titled "DISPLAY PANEL AND DISPLAY DEVICE", filed on Jun. 30, 2023 with the China National Intellectual Property Administration, which is hereby incorporated by reference in its entirety.

FIELD

The present disclosure relates to the field of display technologies, and in particular to a display panel and a display device.

BACKGROUND

Display panels are widely used with the development of display technologies. Transparent displays, as a new display mode, are used in many fields, such as in billboards and vehicle windows.

At present, display of the transparent display is influenced not only by its own internal devices, but also by external background light, which may lead to a poor display effect of the transparent display.

Therefore, a new display device is urgently needed.

SUMMARY

A display panel and a display device are provided according to embodiments of the present disclosure.

In one embodiment, a display panel is provided according to an embodiment of the present disclosure. The display panel includes a display area including multiple pixel areas and multiple light transmissive areas arranged in an array. The display panel further includes a dimming part and at least one photosensitive component. Along a thickness direction of the display panel, at least a part of the dimming part at least partially overlaps with the light transmissive areas. The photosensitive component is electrically connected to the dimming part.

On the other hand, a display device is further provided according to an embodiment of the present disclosure. The display device includes the display panel described above.

BRIEF DESCRIPTION OF THE DRAWINGS

To describe the embodiments of the present disclosure more clearly, the drawings required for describing the embodiments of the present disclosure are described briefly hereinafter. Apparently, the drawings in the following description show only some embodiments of the present disclosure.

Figure 1:
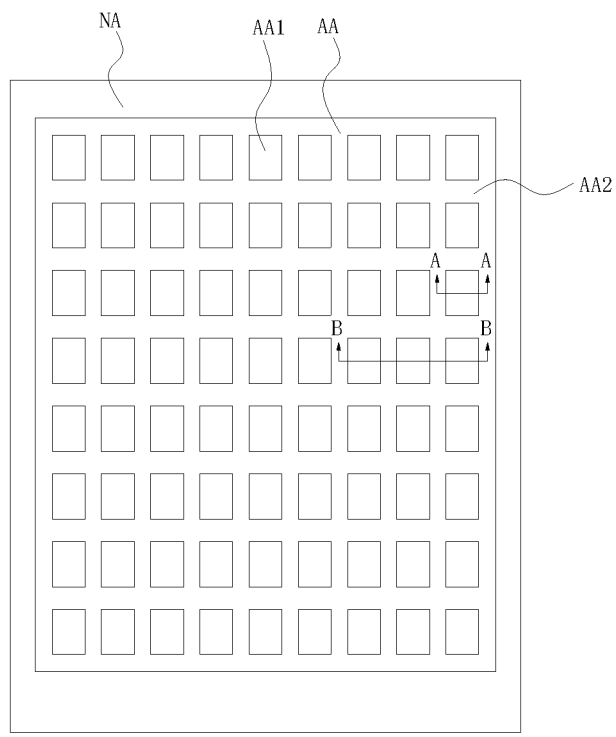
FIG. 1 is a schematic top view of a display panel according to some embodiments of the present disclosure.

Reference numerals are listed as follows:

100. Display panel; 200. Display device;

AA. Display area; NA. Non-display area; AA1. Pixel area; AA2. Light transmissive area; S1. Light-emitting surface; S2, Light-receiving surface; P. Partition; P1. First partition; P2. Second partition;

10. Dimming part; 11. Liquid crystal cell; 111. First electrode; 112. Second electrode; 113. Dyed liquid crystal layer; 113a. Dyed liquid crystal molecule; 12. First substrate; 13. Second substrate;

20. Photosensitive component; 21. Photosensitive part;

30. Display substrate;

40. Array layer; 41. Thin film transistor; 411. Gate electrode; 412. Active layer; 42. Hollow part; 43. Conductive connection part; 44. Dimming circuit; 45. First signal line; 46. Second signal line; 47. Functional part;

50. Light emitting device; 51. Electrical contact part;

61. First light shielding part; 62. Second light shielding part;

X. First direction; Y. Second direction; Z. Third direction.

In the drawings, the same members are indicated by the same reference numerals. The drawings are not drawn to actual scale.

DETAILED DESCRIPTION OF EMBODIMENTS

The embodiments of the present disclosure are described hereinafter in detail. In the following detailed description, many specific details are set forth to provide a thorough understanding of the present disclosure. However, embodiments of the present disclosure may be implemented without some of these specific details. The following description of the embodiments is only intended to provide better understanding of the present disclosure by illustrating embodiments of the present disclosure.

It should be noted that, without conflict, the embodiments of the present disclosure and features in the embodiments may be combined with each other. The embodiments are described in detail below with reference to the drawings.

The relationship terms such as "first" and "second" are used for distinguishing an entity or operation from another entity or operation, rather than requiring or implying an actual relationship or order between these entities or operations. Further, the terms "include", "comprise" or any variant thereof are intended to encompass nonexclusive inclusion and a process, method, article or apparatus including a series of elements includes not only those elements but also other elements which have not been listed definitely or an element(s) inherent to the process, method, article or apparatus. Unless expressively limited otherwise, a process, method, article or apparatus limited by "comprising/including a(n) . . . " does not exclude existence of another identical element in such process, method, article or apparatus.

It should be understood that in description of the structure of the component, when a layer or an area is referred to be "on" or "above" another layer or another area, it may be directly above the another layer or the another area, or other layers or areas may be included between the layer or the area and the another layer or the another area. And, if the component is flipped, the layer or the area may be located above or below the another layer or the another area.

The term "and/or" herein is only an association relationship to describe the associated objects, indicating that there may be three kinds of relationships, for example, A and/or B may indicate three cases, such as A exists alone, A and B exist at the same time, and B exists alone. In addition, the character "/" herein indicates that the associated objects before and after the character "/" are in an "or" relationship.

It should be understood that in the embodiments of the present disclosure, "B corresponding to A" means that B is associated with A, and B may be determined based on A. However, it should also be understood that determining B based on A does not mean determining B only based on A, but also based on A and/or other information.

Compared with an Organic Light Emitting Display (OLED, which is also referred to as Organic Electroluminescent display, OELD) and a Thin Film Transistor Liquid Crystal Display (TFT-LCD), a Micro Light Emitting Diode Display (Micro LED) does not acquire additional packaging and polarizer structure, and can achieve higher transparency in a transparent display.

However, as a transparent area increases, an area through which background light may pass increases. In a case that intensity of the background light is strong, brightness of the background light affects brightness of a display screen, which reduces contrast of the display screen, thus reducing a display effect.

Therefore, in order to solve the above problems, a display panel and a display device are provided according to embodiments of the present disclosure.

In order to better understand the embodiments of the present disclosure, a display panel and a display device according to embodiments of the present disclosure will be described in detail with reference to FIG. 1 to FIG. 22.

Figure 2:
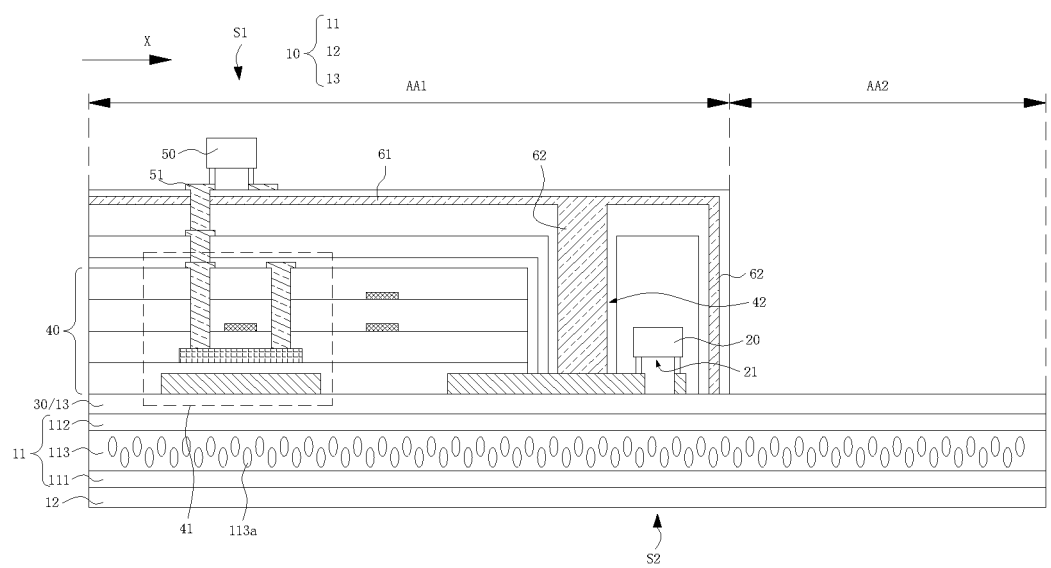
FIG. 2 is a schematic cross-sectional view taken along line A-A in FIG. 1 according to an embodiment of the present disclosure.

FIG. 1 is a schematic top view of a display panel according to some embodiments of the present disclosure. FIG. 2 is a schematic cross-sectional view taken along line A-A in FIG. 1 according to an embodiment of the present disclosure.

As shown in FIG. 1 and FIG. 2, a display panel is provided according to an embodiment of the present disclosure. The display panel includes a display area AA. The display area AA includes multiple pixel areas AA1 and multiple light transmissive areas AA2, the multiple pixel areas AA1 and the multiple light transmissive areas AA2 are arranged in an array. The display panel further includes a dimming part 10 and at least one photosensitive component 20. At least a part of the dimming part 10 overlaps with at least a part of the light transmissive areas AA2 along a thickness direction of the display panel. The photosensitive component 20 is electrically connected to the dimming part 10.

In an embodiment of the present disclosure, a display panel includes a display area AA, which may be configured to display a screen of the display panel. The pixel areas AA1 included in the display area AA may achieve display of the screen. In the display area AA, the multiple pixel areas AA1 are arranged in an array. In an embodiment, each of the pixel areas AA1 may include one or more light emitting devices 50. Each of the pixel areas AA1 including multiple light emitting devices 50 is taken as an example. In this case, each of the pixel areas AA1 may include a red light emitting device, a blue light emitting device and a green light emitting device. In this way, each of the pixel areas AA1 may emit light of one or more colors. Of course, the display area AA may further include non-pixel areas AA1, such as light transmissive areas AA2 and an area where an array circuit is located. The display panel may further include a non-display area NA. For example, the non-display area NA is arranged around the display area AA. The non-display area NA may alternatively be the non-pixel area AA1. In some examples, the non-display area NA may include a virtual pixel area AA1, which does not participate in screen display of the display panel, and may be connected to other structures in the non-display area NA to achieve different functions.

In an embodiment, multiple light transmissive areas AA2 included in the display area AA are arranged in an array. Of course, the multiple light transmissive areas AA2 may be interconnected to form a grid. A film layer in the display panel corresponding to the light transmissive areas AA2 has high transparency or is completely transparent. Correspondingly, the display panel may further include a non-transmissive area, and a film layer in the display panel corresponding to the non-transmissive area has low transparency or is opaque, such as an array circuit layer, a wiring layer and a light emitting device 50. An area where the light emitting device 50 is located may also be referred to as the pixel area AA1. It is to be understood that in the embodiment of the present disclosure, the light transmissive areas AA2 of the display panel enables background light on one side of the display panel opposite to a light-emitting side to pass through the light transmissive areas AA2 and be emitted from the light-emitting side, and a background may be observed through the display panel in a case that a screen is not displayed on the display panel. For example, if the display panel is applied to a vehicle window, a user may not only open the display panel to watch a display screen on the vehicle window, but also close the display panel to see outside through the vehicle window.

In an embodiment of the present disclosure, the display panel further includes a dimming part 10 and a photosensitive component 20. In some examples, along a thickness direction of the display panel, the dimming part 10 may fully overlap with the light transmissive areas. In other examples, along the thickness direction of the display panel, a part of the dimming part 10 may overlap with all the light transmissive parts. In other examples, along the thickness direction of the display panel, a part of the dimming part 10 may overlap with a part of the light transmissive parts. In other examples, along the thickness direction of the display panel, all of the dimming part 10 may overlap with a part of the light transmissive parts.

In an embodiment, one photosensitive component 20 may be provided. Of course, multiple photosensitive components 20 may be provided. In an embodiment, each of the multiple photosensitive components 20 may be connected to the dimming part 10. In one embodiment, the multiple photosensitive components 21 are connected in series and then connected to the dimming part 10. The connection mode between the photosensitive component 20 and the dimming part 10 is not limited in the embodiments of the present disclosure.

In the display panel and the display device according to embodiments of the present disclosure, the display panel includes a display area AA including multiple pixel areas AA1 and multiple light transmissive areas AA2 arranged in an array. The display panel further includes a dimming part 10 which is electrically connected to a photosensitive component 20. The photosensitive component 20 senses an intensity of background light, and adjusts a light transmittance of the dimming part 10 which is electrically connected to the photosensitive component 20. In a thickness direction of the display panel, the dimming part 10 at least partially overlaps with the light transmissive areas AA2. After the light transmittance of the dimming part 10 is adjusted, a light transmittance effect of the light transmissive areas AA2 changes, to reduce an influence of the background light on display brightness of the display panel.

As shown in FIG. 2, in some alternative embodiments, the display panel further includes a display substrate 30, an array layer 40 and a light emitting device 50. The display substrate 30 is located on one side of the dimming part 10. The array layer 40 is located on one side of the display substrate 30 away from the dimming part 10, and includes multiple thin film transistors 41 located in the pixel areas AA1. The light emitting device 50 is located on one side of the array layer 40 away from the display substrate 30, and is electrically connected to the thin film transistors 41.

The display panel being a Micro LED display panel is taken as an example. The display panel may include a display substrate 30, an array layer 40 and a light emitting device 50. A dimming part 10 may be arranged on one side of the display substrate 30 away from the array layer 40, and the dimming part 10 may include a liquid crystal cell 11. The liquid crystal cell 11 may include a liquid crystal layer, an electrode and a transparent substrate, where the electrode may control deflection of liquid crystal in the liquid crystal layer, and the transparent substrate is configured to protect the liquid crystal layer and reduce a possibility that the liquid crystal layer is deformed due to external force. Moreover, the transparent substrate may be the display substrate 30 or a part of a structure of the display substrate 30. The array layer 40 on the display substrate 30 may include multiple driving circuit layers and insulating layers between adjacent driving circuit layers. The light emitting device 50 is connected to a conductive structure in the driving circuit layers. In an embodiment, the light emitting device 50 includes an electrical contact part 51, and the electrical contact part 51 is connected to a thin film transistor in the driving circuit layer by using a bridge wire through a via hole. In an embodiment, a planarization layer and/or an insulating layer may be disposed between the light emitting device 50 and the driving circuit layer. A position of the photosensitive component 20 may be arranged based on design requirements. For example, the photosensitive component 20 is arranged in a same layer as the array layer 40 and adjacent to the driving circuit layer. In one embodiment, the photosensitive component 20 is arranged in the non-display area NA of the display panel. Hereinafter, the positional relationship among the dimming part 10, the display substrate 30, the array layer 40, and the light emitting device described above will be explained. It should be noted that FIG. 2 of the embodiment of the present disclosure only shows a film layer structure of the display panel that highlights the embodiment of the present disclosure, and the film layer structure of the display panel is not limited thereto, but further includes, for example, a packaging structure layer, various insulating layers, a passivation layer, a buffer layer between the display substrate 30 and the array layer 40, and other film layer structures. For details, reference may be made to the structure of the Micro-LED display panel in the related technologies, which is not described in detail here.

Figure 3:
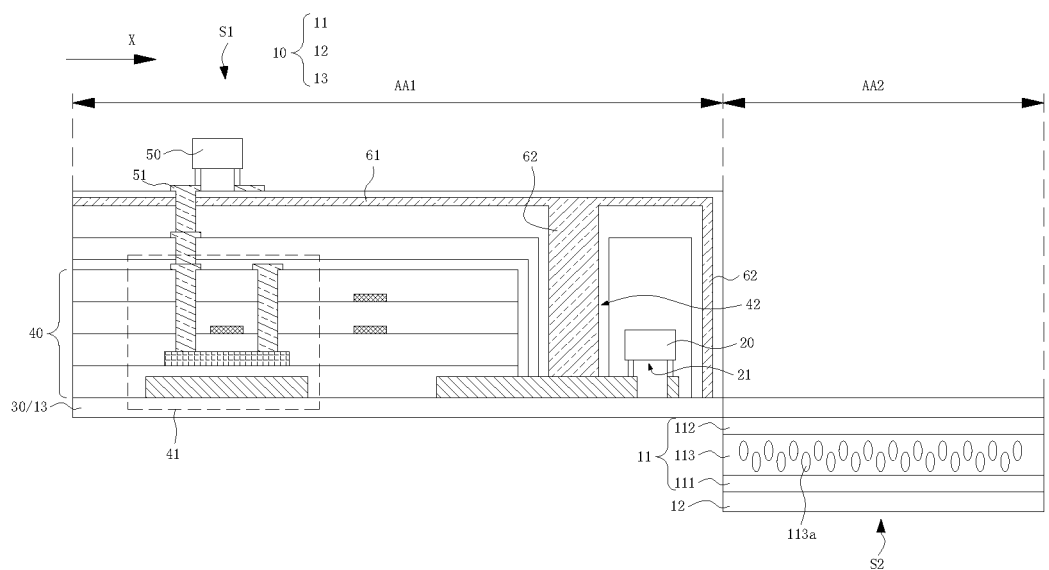
FIG. 3 is a schematic cross-sectional view taken along line A-A in FIG. 1 according to another embodiment of the present disclosure.

FIG. 3 is a schematic cross-sectional view taken along line A-A in FIG. 1 according to another embodiment of the present disclosure.

As shown in FIG. 2 and FIG. 3, in some alternative embodiments, the dimming part 10 includes a liquid crystal cell 11. On a plane where the liquid crystal cell 11 is located, an orthographic projection of the light transmissive area AA2 is located within an orthographic projection of the liquid crystal cell 11.

In the embodiments of the present disclosure, based on the above arrangement, adjustment of brightness of transmitted background light by the dimming part 10 may be achieved by adjusting liquid crystal in the liquid crystal cell 11, which simplifies adjustment of the dimming part 10. Moreover, the adjustment of the brightness of the transmitted background light is more accurate by adjusting the liquid crystal.

In an embodiment of the present disclosure, description is made by taking the plane where the liquid crystal cell 11 is located being a first plane as an example. The first plane is arranged in parallel with a light-emitting surface or a light-entering surface of the liquid crystal cell 11. As shown in FIG. 2, an orthographic projection of the light transmissive area AA2 on the first plane may be smaller than an orthographic projection of the liquid crystal cell 11 on the first plane, and the orthographic projection of the light transmissive area AA2 on the first plane is located within the orthographic projection of the liquid crystal cell 11. In other examples, as shown in FIG. 3, the orthographic projection of the light transmissive area AA2 on the first plane may completely coincide with the orthographic projection of the liquid crystal cell 11 on the first plane.

It is to be understood that the light-entering surface of the liquid crystal cell 11 is a surface where the background light enters the liquid crystal cell 11, and the light-emitting surface of the liquid crystal cell 11 is a surface where the background light emits from the liquid crystal cell 11.

Figure 4:
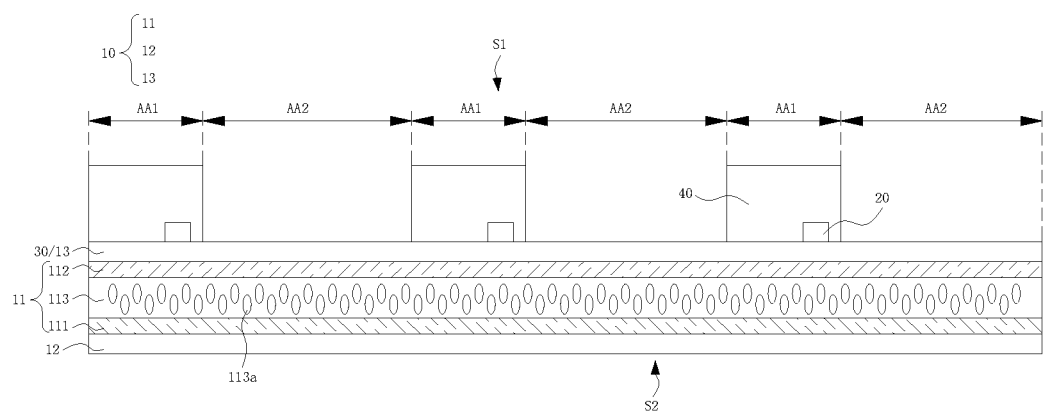
FIG. 4 is a schematic cross-sectional view taken along a line B-B in FIG. 1 according to an embodiment of the present disclosure.

FIG. 4 is a schematic cross-sectional view taken along line B-B in FIG. 1 according to an embodiment of the present disclosure.

As shown in FIG. 4, in some alternative embodiments, the liquid crystal cell 11 includes a first electrode 111, a second electrode 112 and a dyed liquid crystal layer 113, the dyed liquid crystal layer 113 is located between the first electrode 111 and the second electrode 112, and the dyed liquid crystal layer 113 includes multiple dyed liquid crystal molecules 113a. At least one of the first electrode 111 and the second electrode 112 is electrically connected to the photosensitive component 20.

In the embodiment of the present disclosure, by arranging the dyed liquid crystal layer 113, dyed liquid crystal molecules 113a in the dyed liquid crystal layer 113 may change a dimming range of the dimming part 10 from opaque to completely transparent, and the display panel may adjust brightness of background light transmitted through the light transmissive area AA2 based on scenario needs, to improve contrast of the display screen displayed by the display panel.

In an embodiment, the first electrode 111 and the second electrode 112 may be made of the same material. For example, both the first electrode 111 and the second electrode 112 are made of a transparent material, such as Indium Tin Oxide (ITO).

In an embodiment, the first electrode 111 may be a positive electrode and the second electrode 112 may be a negative electrode. Of course, the first electrode 111 may be a negative electrode and the second electrode 112 may be a positive electrode. In an embodiment, the first electrode 111 may be located between the dyed liquid crystal layer 113 and the display substrate 30. Of course, the first electrode 111 may be located on one side of the dyed liquid crystal layer 113 away from the display substrate 30.

In some examples, the photosensitive component 20 may be electrically connected to the first electrode 111. In other examples, the photosensitive component 20 may be electrically connected to the second electrode 112. In still other examples, the photosensitive component 20 is electrically connected to both the first electrode 111 and the second electrode 112.

Figure 5:
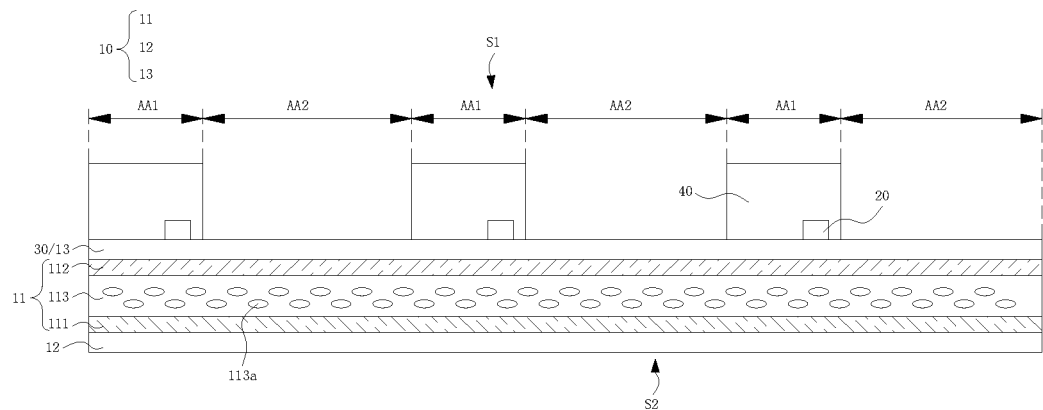
FIG. 5 is a schematic cross-sectional view taken along line B-B in FIG. 1 according to another embodiment of the present disclosure.
Figure 6:
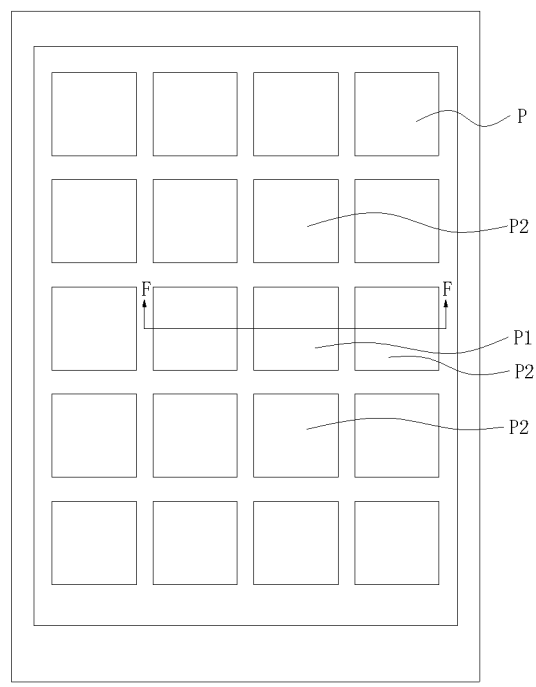
FIG. 6 is a schematic top view of a display panel according to some other embodiments of the present disclosure.
Figure 7:
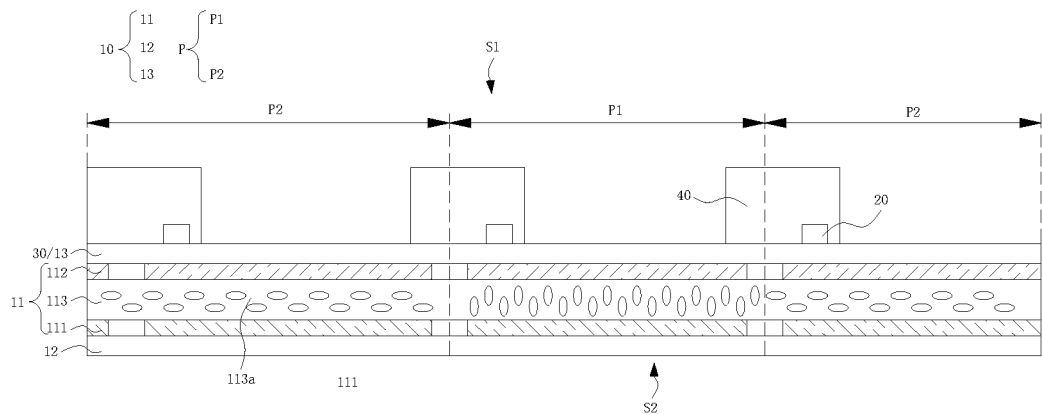
FIG. 7 is a schematic cross-sectional view taken along line F-F in FIG. 6 according to an embodiment of the present disclosure.

FIG. 5 is a schematic cross-sectional view taken along line B-B in FIG. 1 according to another embodiment of the present disclosure. FIG. 6 is a schematic top view of a display panel according to some other embodiments of the present disclosure. FIG. 7 is a schematic cross-sectional view taken along line F-F in FIG. 6 according to an embodiment of the present disclosure.

As shown in FIG. 4 to FIG. 7, in some alternative embodiments, the photosensitive component 20 is configured to generate a brightness signal based on brightness of light incident from the dimming part 10. The dimming part 10 is configured to adjust a voltage of at least one of the first electrode 111 and the second electrode 112 based on the brightness signal to deflect the dyed liquid crystal molecules 113a, where lengths of the dyed liquid crystal molecules 113a along the thickness direction of the display panel correspond to the brightness signal; and the lengths of the dyed liquid crystal molecules 113a along the thickness direction of the display panel are negatively correlated with the brightness of the light incident from the dimming part 10.

In the embodiment of the present disclosure, based on the above arrangement, the photosensitive component 20 receives external background light, and generates a brightness signal corresponding to the external background light, and the dimming part 10 may adjust a voltage between the first electrode 111 and the second electrode 112 based on the brightness signal, to deflect the dyed liquid crystal molecules 113a in the dimming part 10, to adjust brightness of the background light transmitted through the light transmissive area AA2.

In an embodiment of the present disclosure, dyed liquid crystal molecules 113a with an elliptical shape are taken as an example. Each dyed liquid crystal molecule 113a has a long axis and a short axis. As shown in FIG. 4, in a case that brightness of external background light exceeds a preset background light upper threshold of the display panel, the photosensitive component 20 generates a first brightness signal in response to receiving brightness of light emitted from the dimming part 10. The dimming part 10 adjusts a voltage of the first electrode 111 and/or the second electrode 112 based on the first brightness signal, and the voltage reaches a first voltage value. Under the action of the first voltage value, the dyed liquid crystal molecules 113a deflect, and sizes of the dyed liquid crystal molecules 113a along the thickness direction of the display panel are increased, and thus the sizes of the dyed liquid crystal molecules 113a along the thickness direction of the display panel are larger than sizes of the dyed liquid crystal molecules 113a along a direction perpendicular to the thickness direction of the display panel.

As shown in FIG. 5, in a case that brightness of external background light exceeds a preset background light lower threshold of the display panel, the photosensitive component generates a second brightness signal in response to receiving brightness of light emitted from the dimming part 10. The dimming part 10 adjusts the voltage of the first electrode 111 and/or the second electrode 112 based on the second brightness signal, and the voltage reaches a second voltage value. Under the action of the second voltage value, the dyed liquid crystal molecules 113a deflect, and sizes of the dyed liquid crystal molecules 113a along the thickness direction of the display panel are reduced, and thus the sizes of the dyed liquid crystal molecules 113a along the thickness direction of the display panel are smaller than sizes of the dyed liquid crystal molecules 113a along the direction perpendicular to the thickness direction of the display panel.

It should be noted that when light passes through the dyed liquid crystal molecules 113a, a polarization component parallel to the long axis direction is absorbed, and a polarization component perpendicular to the long axis direction is passed. In other words, larger sizes of the dyed liquid crystal molecules 113a along the thickness direction of the display panel causes more light passing through the dyed liquid crystal molecules 113a to be absorbed, resulting in a decrease in brightness of light that is irradiated to the dimming part 10, passes through the dimming part 10, and emitted from the light transmissive area AA2. In a case that the long axis of the dyed liquid crystal molecules 113a is parallel to the thickness direction of the display panel, light may be completely absorbed by the dyed liquid crystal molecules 113a, and the dimming part 10 is opaque in this case. Smaller sizes of the dyed liquid crystal molecules 113a along the thickness direction of the display panel causes less light passing through the dyed liquid crystal molecules 113a to be absorbed by the dyed liquid crystal molecules 113a, resulting in a slightly decreased or even constant brightness of light that is irradiated to the dimming part 10, passes through the dimming part 10, and emitted from the light transmissive area AA2. In a case that the long axis of the dyed liquid crystal molecule 113*a* is perpendicular to the thickness direction of the display panel, light may completely pass through the dyed liquid crystal molecules 113*a*, and the dimming part 10 is completely transparent in this case.

In some examples, as shown in FIG. 6 and FIG. 7, the display panel is divided into multiple partitions P, and each of the partitions P is controlled by an independent first electrode 111 and an independent second electrode 112. In some cases, an intensity of background light irradiated to some partitions P in the display panel is greater than an intensity of background light irradiated to partitions P around these partitions. A partition P with high intensity of irradiated background light is a first partition P1, and a partition around the first partition P1 with low intensity of irradiated background light is a second partition P2. In this case, only dyed liquid crystal molecules in the first partition P1 may be adjusted, or the first partition P1 and the second partition P2 may be adjusted separately, to improve the uniformity of intensity of background light transmitted through the first partition P1 and the second partition P2. In an embodiment, each of the partitions P may include one or more photosensitive components 20. It is to be understood that each of the partitions P includes one or more light transmissive areas AA2. In order to improve the accuracy of adjustment of the light transmissive area AA2 in each of the partitions P, in each of the partitions P, a projection of the independent electrode along the thickness direction of the display panel overlaps with a projection of the light transmissive area AA2 along the thickness direction of the display panel. There is a gap between the first electrodes 111 or the second electrodes 112 of two adjacent partitions P. A projection of the gap along the thickness direction of the display panel overlaps with a projection of a non-transmissive area along the thickness direction of the display panel.

Figure 8:
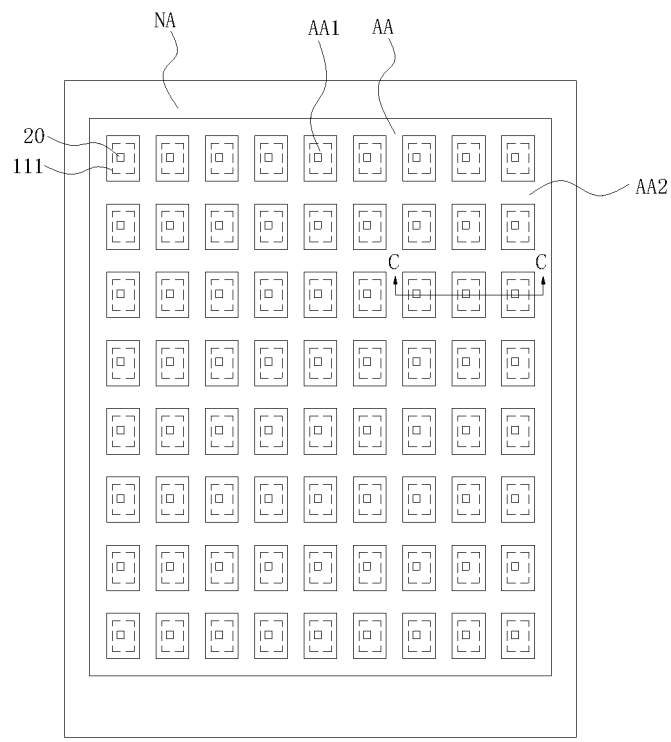
FIG. 8 is a schematic top view of a display panel according to some other embodiments of the present disclosure.
Figure 9:
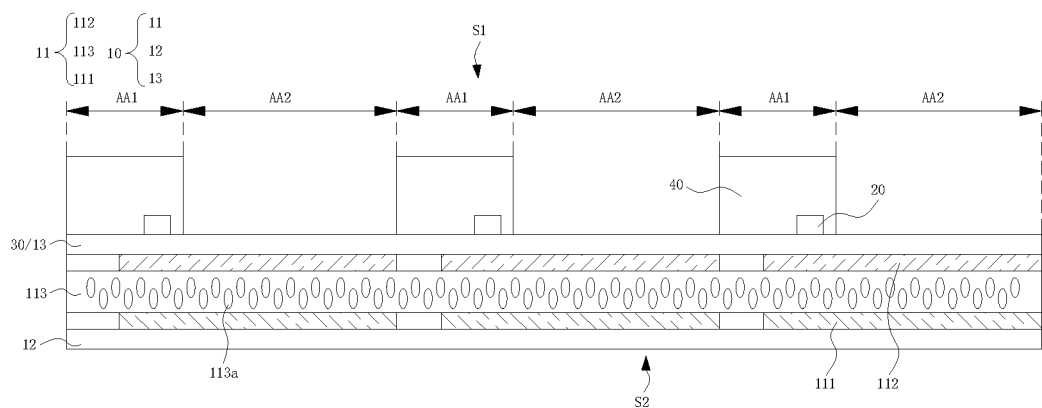
FIG. 9 is a schematic cross-sectional view taken along line C-C in FIG. 8 according to an embodiment of the present disclosure.
Figure 10:
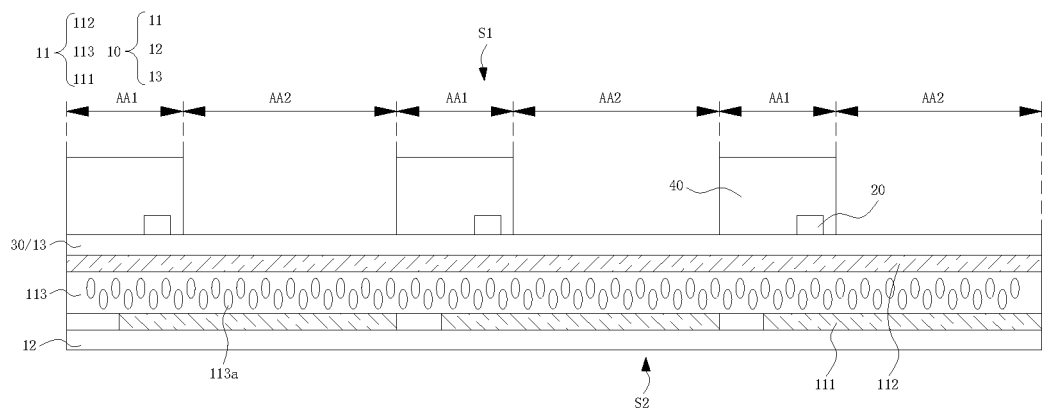
FIG. 10 is a schematic cross-sectional view taken along line C-C in FIG. 8 according to another embodiment of the present disclosure.

FIG. 8 is a schematic top view of a display panel according to some other embodiments of the present disclosure. FIG. 9 is a schematic cross-sectional view taken along line C-C in FIG. 8 according to an embodiment of the present disclosure. FIG. 10 is a schematic cross-sectional view taken along line C-C in FIG. 8 according to another embodiment of the present disclosure.

As shown in FIG. 8 to FIG. 10, in some alternative embodiments, multiple first electrodes 111 are provided, and are arranged in an array, and at least two of the first electrodes 111 are respectively electrically connected to photosensitive components 20 in different pixel areas AA1.

In the embodiment of the present disclosure, based on the above arrangement, dimming parts 10 corresponding to different pixel areas AA1 may be independently adjusted, to independently adjust brightness of background light of light transmissive areas AA2 around different pixel areas AA1, and a possibility of local contrast abnormality in the display panel is reduced, and the uniformity of the screen displayed by the display panel is improved.

In an embodiment, multiple first electrodes 111 are electrically connected to photosensitive components 20 in the multiple pixel areas AA1 in one-to-one correspondence. For example, each of the pixel areas AA1 is provided with a photosensitive component 20, and the photosensitive component 20 in each of the pixel areas AA1 is electrically connected to one of the first electrodes 111 in one-to-one correspondence. Of course, multiple pixel areas AA1 may be electrically connected to one first electrode 111.

In an embodiment, as shown in FIG. 9, multiple second electrodes 112 may be provided, and the multiple first electrodes 111 are arranged in one-to-one correspondence to the multiple second electrodes 112. In one embodiment, as shown in FIG. 10, one second electrode 112 is provided, and the one second electrode 112 corresponds to the multiple first electrodes 111.

Figure 11:
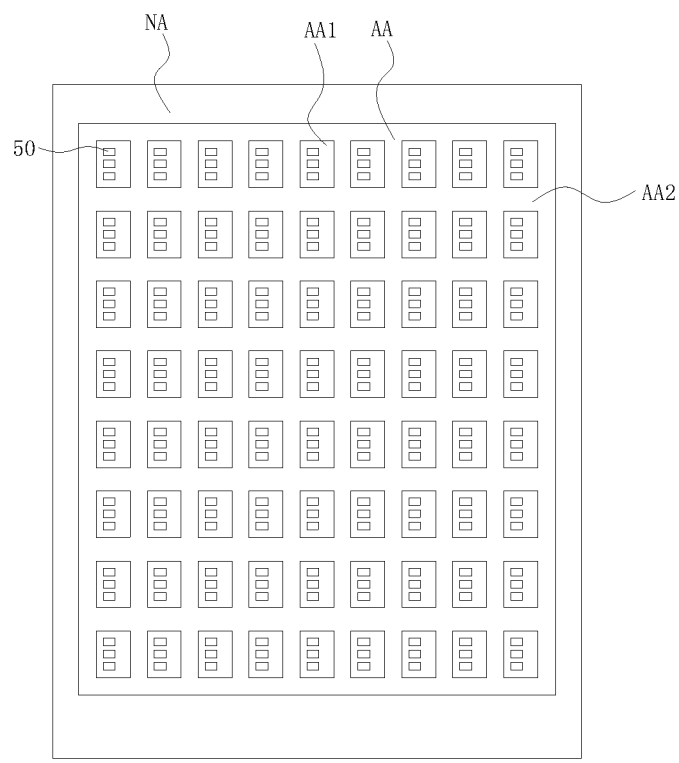
FIG. 11 is a schematic top view of a display panel according to some other embodiments of the present disclosure.

FIG. 11 is a schematic top view of a display panel according to some other embodiments of the present disclosure.

As shown in FIG. 11, in some alternative embodiments, at least one of the light transmissive areas AA2 is arranged around the pixel area AA1. In an embodiment, the at least one light transmissive area is arranged around the pixel area in a closed manner. In an embodiment, the at least one light transmissive area is arranged around the pixel area in an unclosed manner. The display panel further includes multiple light emitting devices 50, and at least two of the light emitting devices 50 are located in a same one of the pixel areas AA1.

In the embodiment of the present disclosure, based on the above arrangement, luminous brightness or light chromaticity in a single pixel area AA1 can be improved, and the display screen of the display panel is more vivid.

In an embodiment, in a same pixel area AA1, colors of the multiple light emitting devices 50 may be different. For example, the same pixel area AA1 includes a red light emitting device, a blue light emitting device and a green light emitting device. Of course, in a same pixel area AA1, colors of the multiple light emitting devices 50 may be the same, to improve monochromatic luminous brightness of the pixel area AA1.

In some examples, multiple light emitting devices 50 may form a pixel unit. In an embodiment, the pixel unit may include at least two light emitting devices 50 with different colors. The photosensitive component 20 is arranged adjacent to a light emitting device with a first color, which is non-red. Sensitivity of the photosensitive component 20 to red light is higher than sensitivity of the photosensitive component 20 to other colors. In the present disclosure, based on the above arrangement, a possibility that light emitted by the light emitting devices 50 interferes with the photosensitive component 20 can be reduced.

As shown in FIG. 10, in some alternative embodiments, the display panel further includes a display unit and a display substrate 30. The display unit is located on one side of the display substrate 30 away from the dimming part 10. The dimming part 10 includes a first substrate 12 and a second substrate 13. The first substrate 12 is located on one side of the second substrate 13 away from the display unit, and the second substrate 13 serves as the display substrate 30.

In the embodiment of the present disclosure, based on the above arrangement, a film layer structure in the display panel is simplified by reusing a film layer, thus reducing an overall thickness of the display panel.

In an embodiment of the present disclosure, the display unit may include one or more light emitting devices 50. In an embodiment, multiple display units may be provided, and each of the display units includes one or more light emitting devices 50. In some alternative examples, the display unit may further include a thin film transistor 41. For example, each display unit includes a thin film transistor 41 and a light emitting device 50 electrically connected to the thin film transistor 41.

The dimming part 10 being the liquid crystal cell 11 is taken as an example. The first substrate 12 and the second substrate 13 are two substrates of the liquid crystal cell 11, and an electrode and a dyed liquid crystal layer 113 are arranged between the first substrate 12 and the second substrate 13. The second substrate 13 serves as the display substrate 30. In other words, a display unit is provided on the second substrate 13 of the dimming part 10. Of course, in some examples, the second substrate 13 may serve as a part of the display substrate 30.

In an embodiment, both the first substrate 12 and the second substrate 13 may be made of transparent materials. For example, the first substrate 12 is a glass substrate.

Figure 12:
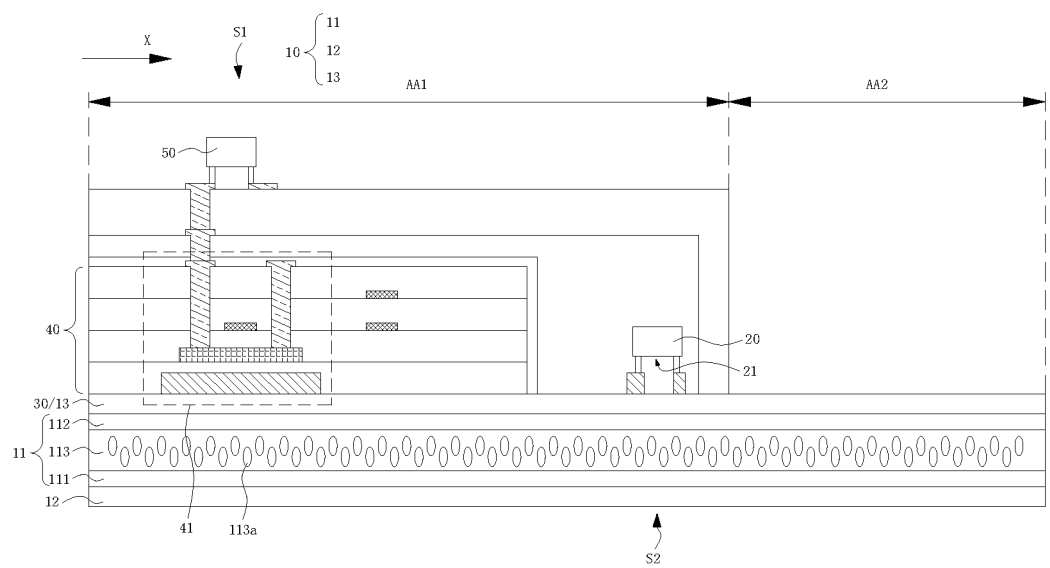
FIG. 12 is a schematic cross-sectional view taken along line A-A in FIG. 1 according to another embodiment of the present disclosure.

FIG. 12 is a schematic cross-sectional view taken along line A-A in FIG. 1 according to another embodiment of the present disclosure.

As shown in FIG. 10 and FIG. 12, in some alternative embodiments, the display panel further includes a light-emitting surface S1 and a light-receiving surface S2, where the light-emitting surface S1 is located on one side of the display substrate 30 away from the dimming part 10, and the light-receiving surface S2 is located on one side of the dimming part away from the display substrate 30. The light emitting device 50 is arranged closer to the light emitting surface S1 as compared with the photosensitive component 20. The photosensitive component 20 includes a photosensitive part 21, and the photosensitive part 21 is arranged facing towards the light-receiving surface S2.

In the embodiment of the present disclosure, based on the above arrangement, when the photosensitive part 21 of the photosensitive component 20 receives external background light, an influence from light emitted from the light-emitting surface S1 on brightness of the external background light received by the photosensitive component 20 is reduced. Therefore, the photosensitive component 20 may obtain the brightness of the external background light more accurately, and thus the accuracy of adjusting the brightness of the background light by the dimming part 10 is improved.

The application of the display panel in the vehicle window is still taken as an example. The light-emitting surface S1 is used to display a screen of the display panel, and the light-receiving surface S2 is used for a user to see outside through the vehicle window. Of course, in some scenarios, the light-emitting surface S1 may be used to display a screen of the display panel, and the light-receiving surface S2 may be used for a user to observe an internal structure of a device where the display panel is located.

As shown in FIG. 12, in some alternative embodiments, a projection of the light transmissive area AA2 along the thickness direction of the display panel at least partially overlaps with a projection of the light-receiving surface S2 along the thickness direction of the display panel.

In the embodiment of the present disclosure, based on the above arrangement, background light received by the light-receiving surface S2 may penetrate through the light transmissive area AA2, to achieve the transparency of the display panel.

In an embodiment, a projection of the light transmissive area AA2 along the thickness direction of the display panel may overlap with a projection of the light-receiving surface S2 along the thickness direction of the display panel. Of course, an area of the light-receiving surface S2 may be larger than an area of the light transmissive area AA2, and the projection of the light transmissive area AA2 along the thickness direction of the display panel is within the projection of the light-receiving surface S2 along the thickness direction of the display panel.

FIG. 12 is a schematic cross-sectional view taken along line A-A in FIG. 1 according to another embodiment of the present disclosure.

As shown in FIG. 12, in some alternative embodiments, the photosensitive component 20 is located in the non-transmissive area, a projection of the photosensitive component 20 in a first direction X overlaps with a projection of the array layer 40 in the first direction X, and the first direction X intersects with the thickness direction of the display panel.

In an embodiment of the present disclosure, both the array layer 40 and the photosensitive component 20 are arranged in the non-transmissive area, and the photosensitive component 20 may obtain brightness of external background light received by different areas in the display area AA, and at the same time, a connection line in the photosensitive component 20 may be made together with a conductive layer in the array layer to simplify the manufacturing process and reducing the manufacturing cost.

In an embodiment, a projection of the photosensitive component 20 in a first direction X overlaps with a projection of the array layer 40 in the first direction X, and at least a part of the photosensitive component 20 is arranged in a same layer as the array layer 40. For example, the photosensitive component 20 may be arranged in a same layer as the thin film transistor 41. Of course, in order to flatten the light-emitting surface S1 and reduce a possibility that the photosensitive component 20 is shifted or touched, some film layers in the array layer 40 are arranged to coat the photosensitive component 20. For example, the photosensitive component 20 may be coated with a planarization layer. In an embodiment, a material of the planarization layer includes a material with high transparency. In an embodiment, the first direction X is perpendicular to the thickness direction of the display panel.

Figure 13:
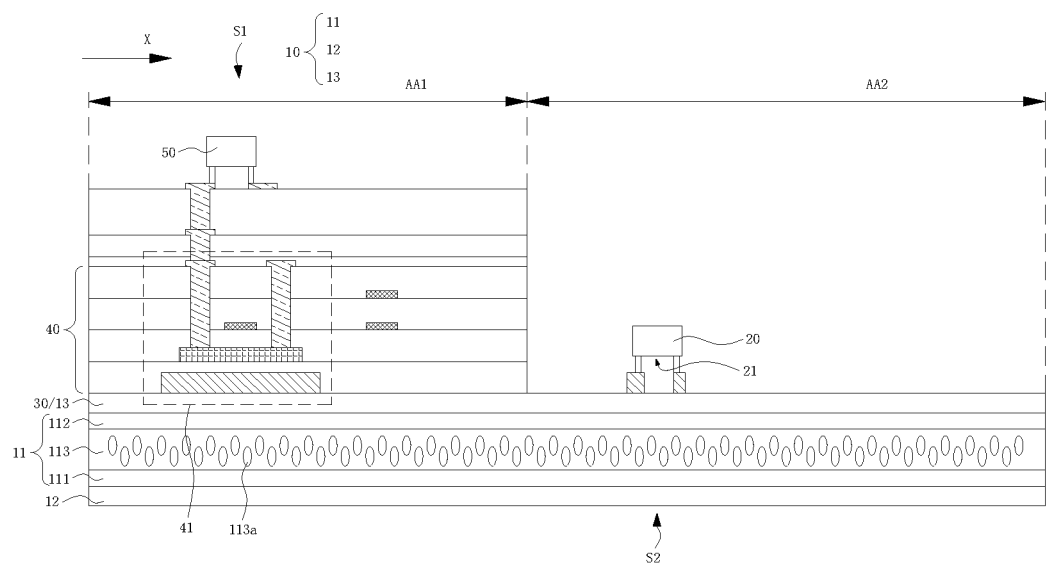
FIG. 13 is a schematic cross-sectional view taken along line A-A in FIG. 1 according to another embodiment of the present disclosure.

FIG. 13 is a schematic cross-sectional view taken along line A-A in FIG. 1 according to another embodiment of the present disclosure.

As shown in FIG. 13, in other some examples, the photosensitive component 20 may also be located in the light transmissive area AA2. It is to be understood that in a case that the photosensitive component 20 is located in the light transmissive area AA2, the photosensitive part 21 is required to be arranged facing toward the light-receiving surface S2, to reduce an influence of light from the light-emitting surface S1.

Figure 14:
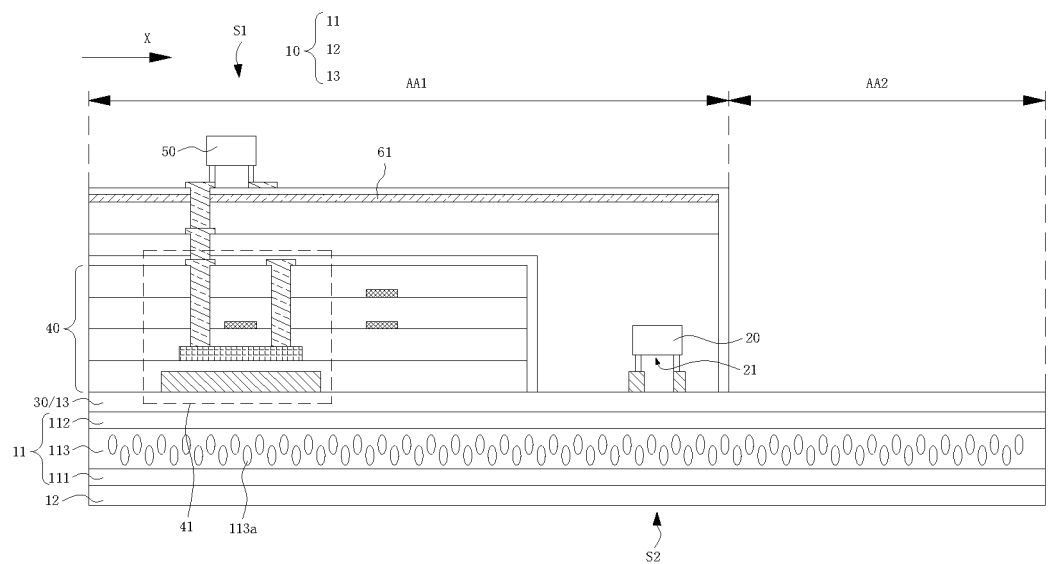
FIG. 14 is a schematic cross-sectional view taken along line A-A in FIG. 1 according to another embodiment of the present disclosure.

FIG. 14 is a schematic cross-sectional view taken along line A-A in FIG. 1 according to another embodiment of the present disclosure.

As shown in FIG. 14, in some alternative embodiments, the array layer 40 further includes a first light shielding part 61, the first light shielding part 61 is located between the thin film transistor 41 and the light emitting device 50, and the first light shielding part 61 is located on one side of the photosensitive component 20 away from the display substrate 30.

In the embodiment of the present disclosure, based on the above arrangement, a possibility that light emitted by the light emitting device 50 irradiates to the thin film transistor 41 is reduced, a possibility that the thin film transistor 41 is damaged after being irradiated by light is reduced, an influence of light from the light-emitting surface S1 on the photosensitive component 20 is reduced, and the accuracy of the photosensitive component in receiving brightness of background light from the light-receiving surface S2 is improved.

In an embodiment, the first light shielding part 61 may be made of black light absorbing material, or may be made of a combination of black pigment, dye or colorant and other materials. In some embodiments, the first light shielding part 61 is made of, for example, titanium black, lignin black, composite oxide pigments of iron or manganese, and a combination thereof.

In an embodiment, the first light shielding part 61 may be located on one side of a planarization layer away from the display substrate 30, where the planarization layer is located on one side of the array layer 40 away from the display substrate 30. In an embodiment, the first light shielding part 61 may be arranged between the light emitting device 50 and the photosensitive component 20 as a whole layer.

Figure 15:
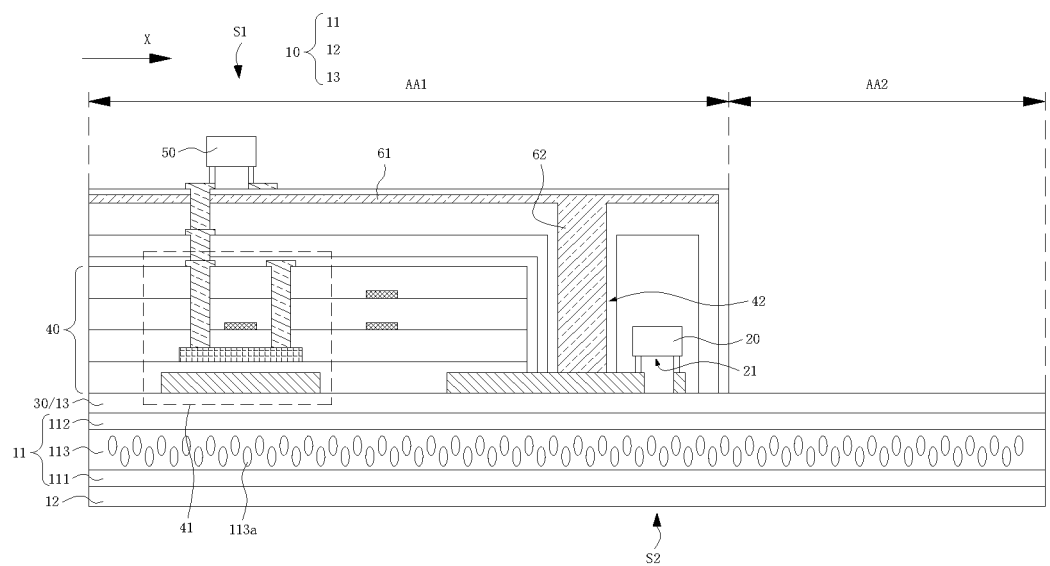
FIG. 15 is a schematic cross-sectional view taken along line A-A in FIG. 1 according to another embodiment of the present disclosure.
Figure 16:
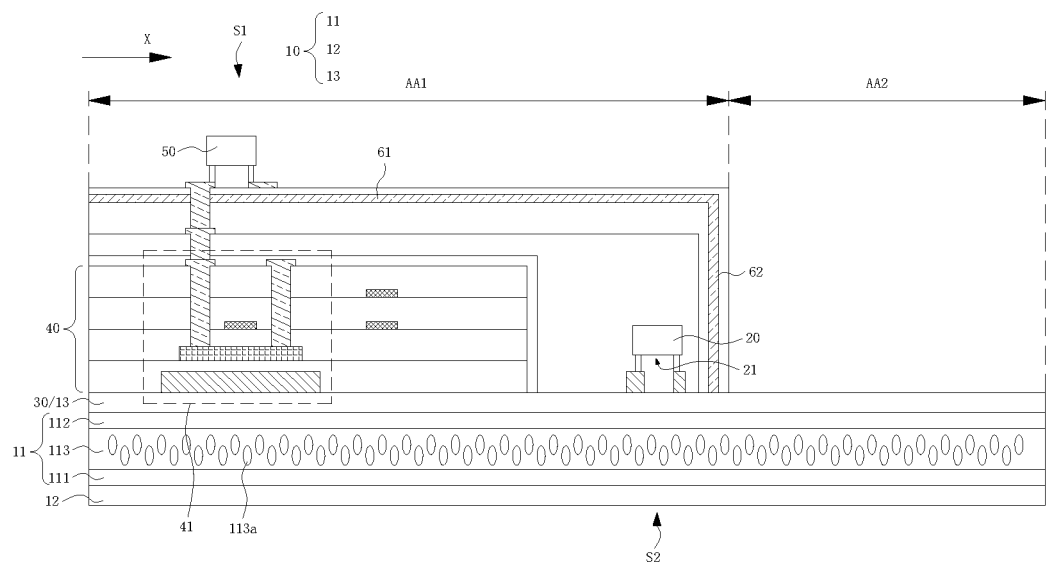
FIG. 16 is a schematic cross-sectional view taken along line A-A in FIG. 1 according to another embodiment of the present disclosure.

FIG. 15 is a schematic cross-sectional view taken along line A-A in FIG. 1 according to another embodiment of the present disclosure. FIG. 16 is a schematic cross-sectional view taken along line A-A in FIG. 1 according to another embodiment of the present disclosure.

As shown in FIG. 2, FIG. 15 and FIG. 16, in some alternative embodiments, the display panel further includes a second light shielding part, where an orthographic projection of the second light shielding part 62 on the display substrate 30 is located between an orthographic projection of the light emitting device 50 on the display substrate 30 and an orthographic projection of the photosensitive component 20 on the display substrate 30; and/or the second light shielding part 62 is located between the light transmissive area AA2 and the photosensitive component 20.

In the embodiment of the present disclosure, the second light shielding part 62 is provided to reduce a possibility that background light irradiated from the light-receiving surface S2 to the photosensitive component 20 is reflected by the photosensitive component or other film layers to the thin film transistor 41 to damage the thin film transistor 41, reduce a possibility that light irradiated from the light-emitting surface S1 to the light transmissive area AA2 is irradiated to the photosensitive component 20, and improve the accuracy of the photosensitive component 20 in receiving brightness of background light from the light-receiving surface S2.

In an embodiment, a material of the second light shielding part 62 may be the same as the material of the first light shielding part 61.

In an embodiment, the second light shielding part 62 is located between the photosensitive component 20 and the thin film transistor 41.

In some examples, as shown in FIG. 15, an orthographic projection of the second light shielding part 62 on the display substrate 30 is located between an orthographic projection of the light emitting device 50 on the display substrate 30 and an orthographic projection of the photosensitive component 20 on the display substrate 30. In other examples, as shown in FIG. 16, the second light shielding part 62 is located between the light transmissive area AA2 and the photosensitive component 20. In still other examples, as shown in FIG. 2, the second light shielding part 62 includes two parts, where an orthographic projection of one part on the display substrate 30 is located between an orthographic projection of the light emitting device 50 on the display substrate 30 and an orthographic projection of the photosensitive component 20 on the display substrate 30, and the other part is located between the light transmissive area AA2 and the photosensitive component 20.

Figure 17:
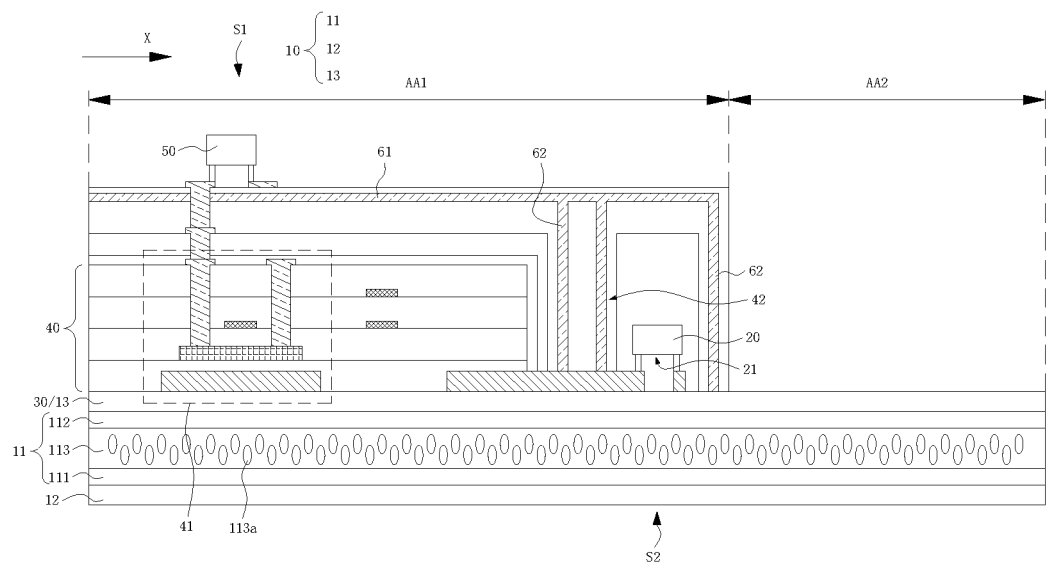
FIG. 17 is a schematic cross-sectional view taken along line A-A in FIG. 1 according to another embodiment of the present disclosure.

FIG. 17 is a schematic cross-sectional view taken along line A-A in FIG. 1 according to another embodiment of the present disclosure.

As shown in FIG. 2 and FIG. 17, in some alternative embodiments, the array layer 40 further includes a hollow part 42, the hollow part 42 is located between the photosensitive component 20 and the thin film transistor 41; and/or at least a part of the hollow part 42 forms the light transmissive area AA2. The second light shielding part 62 covers at least a side wall of the hollow part 42.

In the embodiment of the present disclosure, based on the above arrangement, a possibility that background light irradiated from the light-receiving surface S2 to the photosensitive component 20 is reflected by the photosensitive component 20 or other film layers to the thin film transistor 41 to damage the thin film transistor 41 is reduced, and at the same time, an area occupied by the second light shielding part 62 is reduced, and areas occupied by the photosensitive component 20 and the thin film transistor 41 in the display area AA are reduced, to reduce an area of the non-transmissive area and increasing an area of the light transmissive area AA2 of the display panel.

In an embodiment, the hollow part 42 may be located between the photosensitive component 20 and the thin film transistor 41, and the hollow part 42 may penetrate some of film layers. For example, the hollow part 42 may penetrate at least a part of the conductive film layer and the insulating layer in the thin film transistor 41.

In an embodiment, the hollow part 42 includes a side wall and a bottom surface, which form an accommodation space. As shown in FIG. 17, the second light shielding part 62 may cover the side wall. Of course, the second light shielding part 62 may also cover the bottom surface. In an embodiment, as shown in FIG. 2, in a case that the hollow part 42 is located between the photosensitive component 20 and the thin film transistor 41, the second light shielding part 62 may be arranged to fill the hollow part 42. In an embodiment, a gap between the hollow part 42 and the array layer 40 may be filled by a planarization layer.

In an embodiment, the hollow part 42 may be located on one side of the photosensitive component 20 away from the thin film transistor 41, and the hollow part 42 may form the light transmissive area AA2. Of course, the light transmissive area AA2 formed by the hollow part 42 may also be located in other peripheral areas of the array layer 40.

Figure 18:
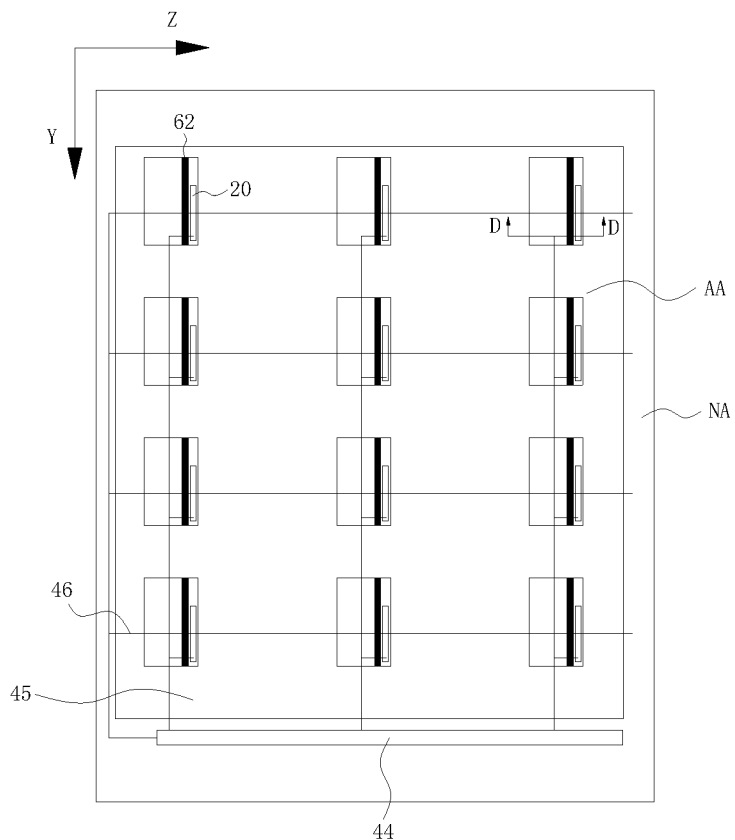
FIG. 18 is a schematic top view of a display panel according to some other embodiments of the present disclosure.
Figure 19:
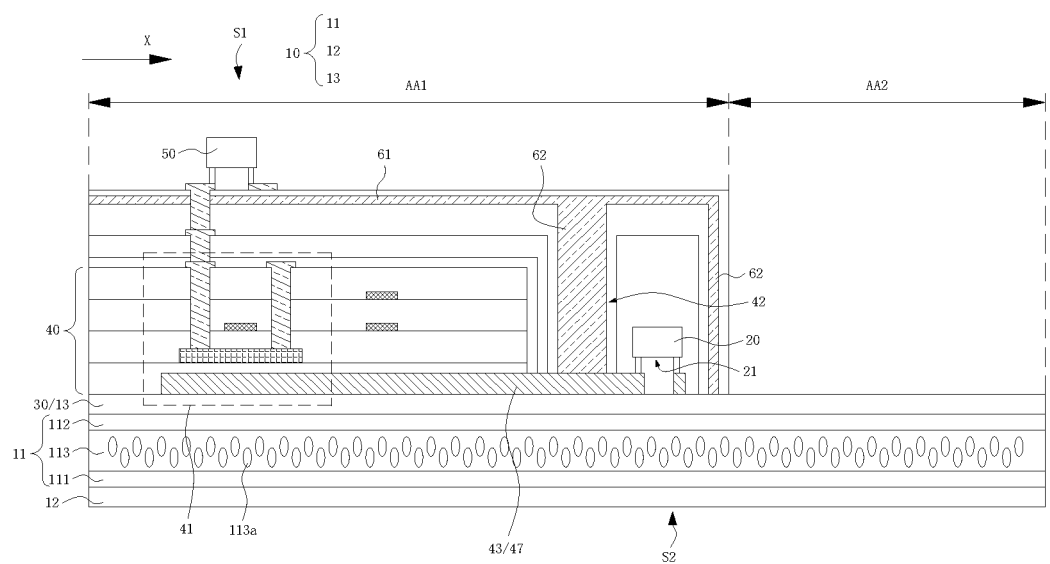
FIG. 19 is a schematic cross-sectional view taken along line D-D in FIG. 18 according to an embodiment of the present disclosure.

FIG. 18 is a schematic top view of a display panel according to some other embodiments of the present disclosure. FIG. 19 is a schematic cross-sectional view taken along line D-D in FIG. 18 according to an embodiment of the present disclosure.

As shown in FIG. 18 and FIG. 19, in some alternative embodiments, the array layer 40 further includes a conductive connection part 43, a dimming circuit 44 and a first signal line 45, the conductive connection part 43 is electrically connected to the dimming circuit 44 through the first signal line 45, and the photosensitive component 20 is electrically connected to the conductive connection part 43.

In the embodiment of the present disclosure, based on the above arrangement, the dimming circuit 44 may process a brightness signal generated by the photosensitive component 20 and adjust an electrode voltage in the dimming part 10. Moreover, one or more of the conductive connection part 43, the dimming circuit 44 and the first signal line 45 may be formed together with a metal film layer in the array layer 40, to simplify a manufacturing process and reducing a manufacturing cost.

In an embodiment, one or more of the conductive connection part 43, the dimming circuit 44 and the first signal line 45 may be disposed on one side of the display substrate 30 away from the dimming part 10.

In an embodiment, the dimming circuit 44 may be disposed in the non-display area NA.

In an embodiment, the first signal line 45 may extend along a single direction. For example, the display area AA includes multiple photosensitive components 20, which are arranged in rows along a second direction Y and in columns along a third direction Z. One first signal line 45 connects multiple photosensitive components 20 in one column in series along the third direction Z. In some examples, in order to improve the accuracy of acquiring positions of local photosensitive components 20, the array layer 40 may further include a second signal line 46, which connects multiple photosensitive components 20 in one row in series along the second direction Y. The second signal line 46 may be driven in a time-sharing manner to obtain the positions of local photosensitive components 20.

Figure 20:
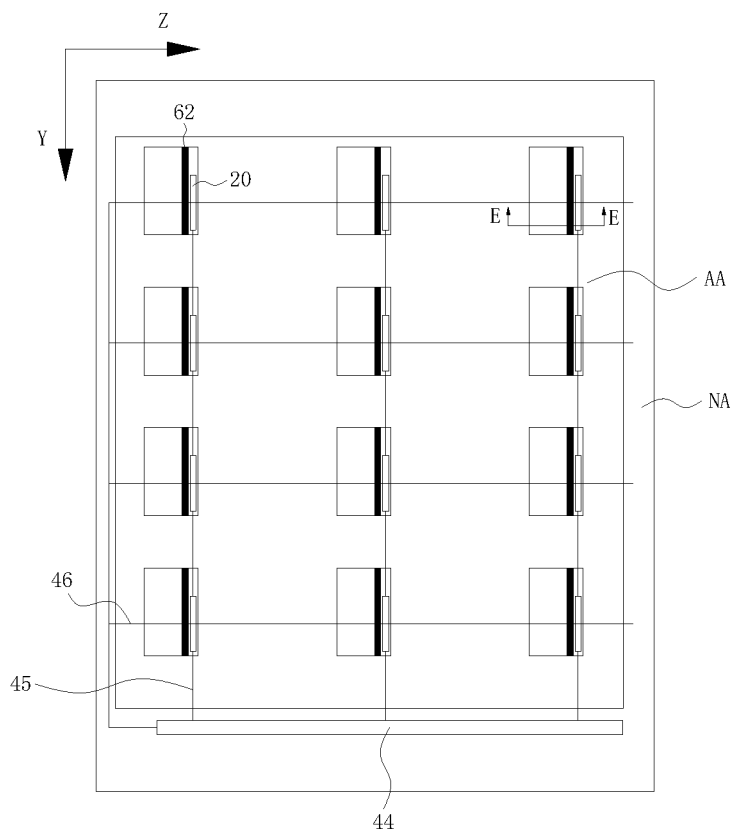
FIG. 20 is a schematic top view of a display panel according to some other embodiments of the present disclosure.
Figure 21:
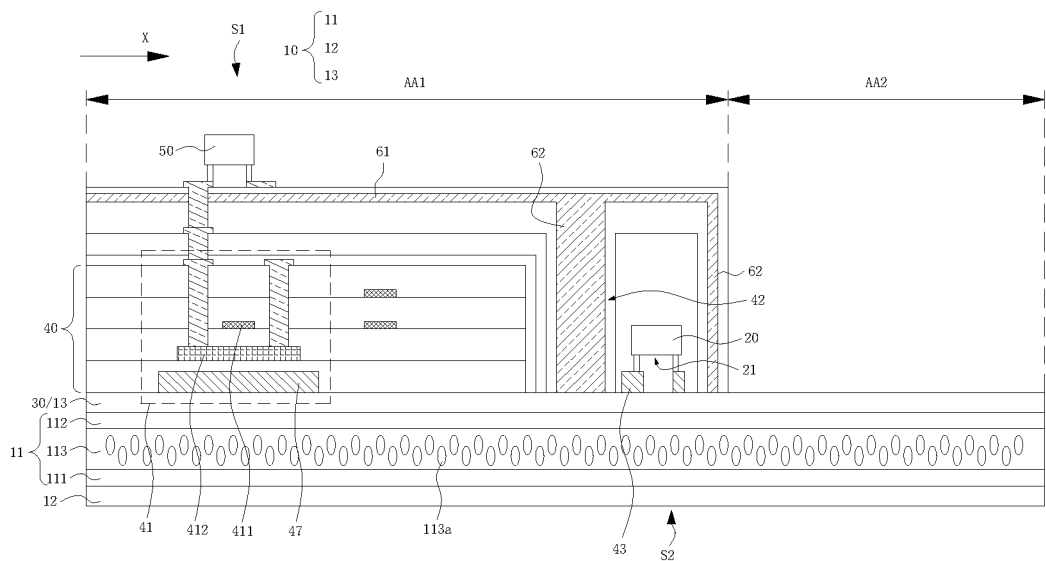
FIG. 21 is a schematic cross-sectional view taken along line E-E in FIG. 20 according to an embodiment of the present disclosure.

FIG. 20 is a schematic top view of a display panel according to some other embodiments of the present disclosure. FIG. 21 is a schematic cross-sectional view taken along line E-E in FIG. 20 according to an embodiment of the present disclosure.

As shown in FIG. 20 to FIG. 21, in some alternative embodiments, the array layer 40 further includes a functional part 47, the functional part 47 is located between the thin film transistor 41 and the display substrate 30, and an orthographic projection of the thin film transistor 41 on the display substrate 30 is located within an orthographic projection of the functional part 47 on the display panel. At least one of the conductive connection part 43 and the first signal line 45 is arranged in a same layer as the functional part 47.

In the embodiment of the present disclosure, based on the above arrangement, the functional part 47 may shield the thin film transistor 41 from light irradiated to the thin film transistor 41 via the dimming part 10 and the display substrate 30, to reduce a possibility of damage to the thin film transistor 41. Moreover, at least one of the conductive connection part 43 and the first signal line 45 may be made at the same time with the functional layer, thus simplifying a manufacturing process and reducing a manufacturing cost.

In an embodiment, a material of the functional part 47 includes a non-transparent material. For example, the material of the functional part 47 includes a metal material.

In some examples, an orthographic projection of the thin film transistor 41 on the display substrate 30 is located within an orthographic projection of the functional part 47 on the display panel. In other words, the orthographic projection of the thin film transistor 41 on the display substrate 30 is smaller than the orthographic projection of the functional part 47 on the display panel. In other examples, an orthographic projection of the thin film transistor 41 on the display substrate 30 overlaps with an orthographic projection of the functional part 47 on the display panel.

In some alternative embodiments of the present disclosure, the conductive connection part 43 is arranged in a same layer as the functional part 47. In other alternative embodiments of the present disclosure, the first signal line 45 is arranged in a same layer as the functional part 47. In still other alternative embodiments of the present disclosure, the conductive connection part 43, the first signal line 45 and the functional part 47 are arranged in a same layer. In an embodiment, as shown in FIG. 18, the conductive connection part 43 and the functional part may be connected. In one embodiment, as shown in FIG. 20, the conductive connection part 43 and the functional part may be separated by the second light shielding part 62.

As shown in FIG. 21, in some alternative embodiments, the functional part 47 is a bottom gate structure of the thin film transistor 41 or a light shielding unit shielding an active layer 412. An orthographic projection of the active layer 412 on the display substrate 30 is located within an orthographic projection of the functional part 47 on the display substrate 30.

In the embodiment of the present disclosure, based on the above arrangement, on the premise that the functional part 47 serves as a part of the thin film transistor 41, a possibility that the active layer 412 is irradiated by light from the light-receiving surface S2 is reduced, and the reliability of the thin film transistor 41 is improved.

In some examples, the thin film transistor 41 includes a top-gate type thin film transistor 41. That is, a gate electrode 411 is located between the active layer 412 and a source/drain electrode. The thin film transistor 41 may include a bottom-gate type thin film transistor 41. That is, the active layer 412 is located between the gate electrode 411 and the source/drain electrode. The thin film transistor 41 may include a double-gate type thin film transistor 41. That is, two gate electrodes 411 exist, one of which is located between the active layer 412 and the source/drain electrode, and the other of which is located on one side of the active layer 412 away from the source/drain electrode.

In an embodiment of the present disclosure, the functional part 47 may be a bottom gate electrode 411 of the thin film transistor 41. In one embodiment, in a case that the thin film transistor 41 is the top-gate type thin film transistor 41, the functional part 47 is located between the active layer 412 and the display substrate 30, and may be a light shielding unit shielding the active layer 412. In an embodiment, an orthographic projection area of the functional part 47 on the display substrate 30 may be greater than or equal to an orthographic projection area of the active layer 412 on the display substrate 30.

As shown in FIG. 18 to FIG. 21, in some alternative embodiments, in a case that the functional part 47 is the light shielding unit, the functional part 47 serves as the first signal line 45.

In the embodiment of the present disclosure, based on the above arrangement, the functional part 47 may not only shield the thin film transistor 41 from light from the light-receiving surface S2, but also transfer a brightness signal of the photosensitive component 20.

Description is made by still taking a case in which the display area AA is provided with multiple photosensitive components 20, and each of the photosensitive components 20 and one or more thin film transistors 41 form one pixel area AA1 as an example. The multiple photosensitive components 20 are arranged in rows along the second direction Y and in columns along the third direction Z. One first signal line 45 connects multiple photosensitive components 20 in one column in series along the third direction Z. In an embodiment, as shown in FIG. 17, the photosensitive component 20 is connected to the functional part 47 below the thin film transistor 41 through the conductive connection part 43. Multiple functional parts 47 are connected in series along the third direction Z to form the first signal line 45. Of course, as shown in FIG. 19, the first signal line 45 may be formed by connecting the conductive connection parts 43 in series.

Figure 22:
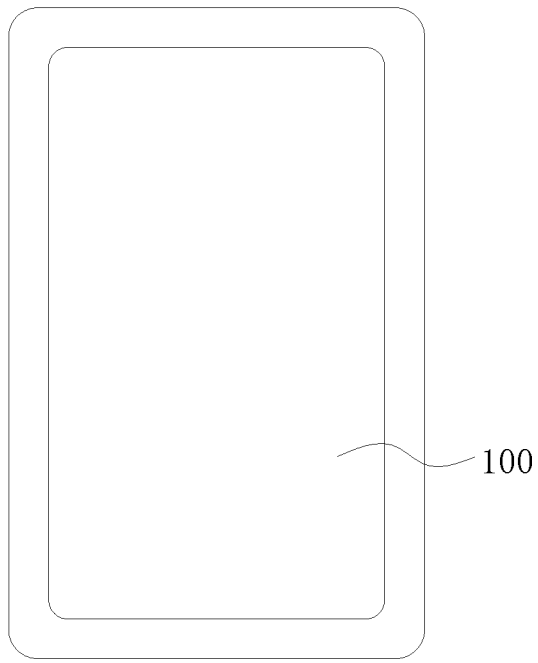
FIG. 22 is a schematic top view of a display device according to some embodiments of the present disclosure.

FIG. 22 is a schematic top view of a display device according to some embodiments of the present disclosure.

In one embodiment, as shown in FIG. 22, a display device 200 is further provided according to an embodiment of the present disclosure. The display device 200 includes the display panel 100 according to any one of the above embodiments.

Since the display device according to the embodiment of the present disclosure includes the display panel according to any one of the above embodiments, the display device according to the embodiment of the present disclosure has the beneficial effects of the display panel according to any one of the above embodiments, which is not repeated here.

Described above are only specific embodiments of the present disclosure, and the protection scope of the present disclosure is not limited thereto. Various modifications or substitutions equivalent to the embodiments may be easily made within the embodiments of the present disclosure. These modifications or substitutions should fall within the protection scope of the present disclosure. Therefore, the protection scope of the present disclosure shall be subject to the protection scope defined in the claims.

What is claimed is:

1. A display panel, comprising:
a display area comprising a plurality of pixel areas and a plurality of light transmissive areas, the plurality of pixel areas and the plurality of light transmissive areas being arranged in an array, and the plurality of pixel areas comprising one or more light emitting devices;
a dimming part, wherein the dimming part is arranged on a side of the one or more light emitting devices facing away from a light-emitting surface of the one or more light emitting devices, and at least a part of the dimming part overlaps with at least a part of the light transmissive areas along a thickness direction of the display panel; and
at least one photosensitive component, wherein the photosensitive component is electrically connected to the dimming part, and the photosensitive component is configured to generate a brightness signal based on brightness of light incident from the dimming part and adjust a light transmittance of the dimming part based on the brightness signal.

2. The display panel according to claim 1, wherein the dimming part comprises a liquid crystal cell; orthographic projections of the light transmissive areas are located within an orthographic projection of the liquid crystal cell on a plane where the liquid crystal cell is located.

3. The display panel according to claim 2, wherein the liquid crystal cell comprises a first electrode, a second electrode and a dyed liquid crystal layer, the dyed liquid crystal layer is located between the first electrode and the second electrode, and the dyed liquid crystal layer comprises a plurality of dyed liquid crystal molecules; and
at least one of the first electrode and the second electrode is electrically connected to the photosensitive component.

4. The display panel according to claim 3, wherein the dimming part is configured to adjust a voltage of at least one of the first electrode and the second electrode based on the brightness signal to deflect the dyed liquid crystal molecules, wherein lengths of the dyed liquid crystal molecules along the thickness direction of the display panel correspond to the brightness signal; and the lengths of the dyed liquid crystal molecules along the thickness direction of the display panel are negatively correlated with the brightness of the light incident from the dimming part.

5. The display panel according to claim 3, wherein a plurality of first electrodes are provided, and are arranged in an array, and at least two of the first electrodes are respectively electrically connected to photosensitive components in different pixel areas.

6. The display panel according to claim 1, wherein at least one of the light transmissive areas is arranged around a pixel area among the pixel areas; the display panel further comprises a plurality of light emitting devices, and at least two of the light emitting devices are located in a same one of the pixel areas.

7. The display panel according to claim 1, further comprising a display unit and a display substrate, wherein the display unit is located on one side of the display substrate away from the dimming part; and
the dimming part comprises a first substrate and a second substrate, the first substrate is located on one side of the second substrate away from the display unit, and the second substrate serves as the display substrate.

8. The display panel according to claim 1, further comprising:
a display substrate located on one side of the dimming part;
an array layer located on one side of the display substrate away from the dimming part, and comprising a plurality of thin film transistors located in the pixel areas; and
a light emitting device located on one side of the array layer away from the display substrate, and electrically connected to the thin film transistors.

9. The display panel according to claim 8, further comprising a light-emitting surface and a light-receiving surface, wherein the light-emitting surface is located on one side of the display substrate away from the dimming part, and the light-receiving surface is located on one side of the dimming part away from the display substrate,
wherein the light emitting device is arranged closer to the light emitting surface as compared with the photosensitive component, the photosensitive component comprises a photosensitive part, and the photosensitive part is arranged facing towards the light-receiving surface.

10. The display panel according to claim 9, wherein projections of the light transmissive areas along the thickness direction of the display panel at least partially overlap with a projection of the light-receiving surface along the thickness direction of the display panel.

11. The display panel according to claim 8, wherein the photosensitive component is located in a non-transmissive area, a projection of the photosensitive component in a first direction overlaps with a projection of the array layer in the first direction, and the first direction intersects with the thickness direction of the display panel.

12. The display panel according to claim 8, wherein the array layer further comprises a first light shielding part, the first light shielding part is located between the thin film transistors and the light emitting device, and the first light shielding part is located on one side of the photosensitive component away from the display substrate.

13. The display panel according to claim 11, further comprising a second light shielding part, wherein an orthographic projection of the second light shielding part on the display substrate is located between an orthographic projection of the light emitting device on the display substrate and an orthographic projection of the photosensitive component on the display substrate; and/or
the second light shielding part is located between the light transmissive areas and the photosensitive component.

14. The display panel according to claim 12, further comprising a second light shielding part, wherein an orthographic projection of the second light shielding part on the display substrate is located between an orthographic projection of the light emitting device on the display substrate and an orthographic projection of the photosensitive component on the display substrate; and/or
the second light shielding part is located between the light transmissive areas and the photosensitive component.

15. The display panel according to claim 13, wherein the array layer further comprises a hollow part, the hollow part is located between the photosensitive component and the thin film transistors; and/or
at least a part of the hollow part forms the light transmissive areas;
wherein the second light shielding part covers at least a side wall of the hollow part.

16. The display panel according to claim 11, wherein the array layer further comprises a conductive connection part, a dimming circuit and a first signal line, the conductive connection part is electrically connected to the dimming circuit through the first signal line, and the photosensitive component is electrically connected to the conductive connection part.

17. The display panel according to claim 16, wherein the array layer further comprises a functional part, the functional part is located between the thin film transistors and the display substrate, and orthographic projections of the thin film transistors on the display substrate are located within an orthographic projection of the functional part on the display panel;
wherein at least one of the conductive connection part and the first signal line is arranged in a same layer as the functional part.

18. The display panel according to claim 17, wherein the functional part is a bottom gate structure of the thin film transistors or a light shielding unit shielding an active layer; and
an orthographic projection of the active layer on the display substrate is located within an orthographic projection of the functional part on the display substrate.

19. The display panel according to claim 18, wherein the functional part is the light shielding unit, and serves as the first signal line.

20. A display device, comprising a display panel, wherein the display panel comprises:
a display area comprising a plurality of pixel areas and a plurality of light transmissive areas, the plurality of pixel areas and the plurality of light transmissive areas being arranged in an array, and the plurality of pixel areas comprising one or more light emitting devices;
a dimming part, wherein the dimming part is arranged on a side of the one or more light emitting devices facing away from a light-emitting surface of the one or more light emitting devices, and at least a part of the dimming part overlaps with at least a part of the light transmissive areas along a thickness direction of the display panel; and
at least one photosensitive component, wherein the photosensitive component is electrically connected to the dimming part, and the photosensitive component is configured to generate a brightness signal based on brightness of light incident from the dimming part and adjust a light transmittance of the dimming part based on the brightness signal.

\* \* \* \* \*